United States Patent
Takinami et al.

(10) Patent No.: US 8,193,870 B2
(45) Date of Patent: Jun. 5, 2012

(54) METHOD AND SYSTEM FOR COMPENSATION OF FREQUENCY PULLING IN AN ALL DIGITAL PHASE LOCK LOOP

(75) Inventors: Koji Takinami, Yokohama (JP); Richard Strandberg, Fremont, CA (US); Paul Cheng-Po Liang, TaiChung (TW)

(73) Assignee: Panasonic Corporation, Osaka (JP)

( * ) Notice: Subject to any disclaimer, the term of this patent is extended or adjusted under 35 U.S.C. 154(b) by 46 days.

(21) Appl. No.: 12/838,820

(22) Filed: Jul. 19, 2010

(65) Prior Publication Data

US 2012/0013407 A1   Jan. 19, 2012

(51) Int. Cl.
*H03B 7/12* (2006.01)
(52) U.S. Cl. .. 331/177 V; 331/96; 331/99; 331/107 DP; 331/172
(58) Field of Classification Search ............ 331/57, 331/96, 99, 107 DP, DIG. 3, 45, 177 V, 175, 331/51, 53, 55, 172
See application file for complete search history.

(56) References Cited

U.S. PATENT DOCUMENTS 6,861,916 B2 * 3/2005 Dally et al. .................. 331/172
7,741,921 B2 * 6/2010 Ismailov ...................... 331/55

OTHER PUBLICATIONS

Matsui, Masataka et al., "A 200 MHz 13 mm$^2$ 2-D DCT Macrocell Using Sense-Amplifying Pipeline Flip-Flop Scheme", IEEE Journal of Solid-State Circuits, vol. 29, No. 12, Dec. 1994, pp. 1482-1490.

* cited by examiner

*Primary Examiner* — Ryan Johnson

(57) ABSTRACT

The present invention is a method and system for compensation of frequency pulling in an all digital phase lock loop. The all digital phase lock loop can utilize a multi-phase oscillator including latches with substantially all of the latches paired with a corresponding dummy cell. The dummy cells can have impedance characteristics, such as variable capacitance values which correspond to the variable capacitance value of the latches such that the sum of the two variable capacitance values remains substantially constant, even when the polarity of the reference clock signal changes. The dummy cells can be, for example, variable capacitors or dummy latches. The phase lock loop can also include a multiplying unit. The multiplying unit can receive a reference clock signal and generate a frequency multiplied reference clock signal.

7 Claims, 7 Drawing Sheets

METHOD AND SYSTEM FOR COMPENSATION OF FREQUENCY PULLING IN AN ALL DIGITAL PHASE LOCK LOOP

BACKGROUND

1. Field of the Invention

The present invention relates to a method and system for compensation of frequency pulling in an all digital phase lock loop.

2. Description of Related Art

A conventional phase lock loop generates an output having an output frequency. The output frequency generally includes a desired oscillation frequency. To generate the output, the conventional phase lock loop utilizes a multi-phase oscillator which includes a plurality of latches. However, such latches have impedance values, such as variable capacitance values that periodically fluctuate depending on the polarity of a reference clock signal that is used to clock the latches. This fluctuation in the variable capacitance value causes frequency pulling in the multi-phase oscillator and generates, for example, spurs in the output frequency. Such spurs can be periodic in the output frequency, and one or more spurs can be located at a frequency close to the desired oscillation frequency.

Generally spurs are undesirable since they reduce the likelihood that the output of the conventional phase lock loop will conform to specifications such as the 3rd Generation Partnership Project ("3GPP") specifications. The number of spurs and/or the closeness in frequency to the desired oscillation frequency may decrease performance significantly.

Thus, there is a need for a method and system for compensation of frequency pulling in an all digital phase lock loop.

SUMMARY OF THE INVENTION

The present invention is, for example, a method and system for compensation of frequency pulling in an all digital phase lock loop. The all digital phase lock loop can utilize a multi-phase oscillator including latches with substantially all of the latches paired with a corresponding dummy cell. The dummy cells can have impedance characteristics, such as variable capacitance values which correspond to the variable capacitance value of the latches such that the sum of the two variable capacitance values remains substantially constant, even when the polarity of the reference clock signal changes.

The dummy cells can be, for example, variable capacitors or dummy latches. The variable capacitors can have, for example, variable capacitance values that can be varied. The variable capacitance values of the variable capacitors can be adjusted so that as the variable capacitance value of the latches increases by a first amount, the variable capacitance value of the variable capacitors decreases by substantially the same amount as the first amount to keep the total capacitance value constant. Likewise, when the variable capacitance value of the latches decreases by a second amount, the variable capacitance value of the variable capacitors increases by substantially the same amount as the second amount.

The dummy latches can have a similar construction as the latches, but instead utilizes an inverter to receive an inverted reference clock signal. Thus, the dummy latches are clocked by an opposite polarity when compared with the latches. For example, when the latches are clocked by the reference clock signal, the dummy latches are not clocked by the reference clock signal. Likewise, when the dummy latches are clocked by the reference clock signal, the latches are not clocked by the reference clock signal. This allows the variable capacitance value of the dummy latches to correspond to the variable capacitance value of the latches so that the sum of both variable capacitance values remains substantially constant. The use of the dummy cells can reduce, for example, spur occurrence in the output of the phase lock loop and/or push spurs further away from the desired oscillation frequency and into higher frequencies.

In another embodiment, the phase lock loop can also include a multiplying unit. The multiplying unit can receive a reference clock signal and generate a frequency multiplied reference clock signal. The frequency multiplied reference clock signal can further reduce spur occurrence in the output of the phase lock loop and/or push spurs further away from the desired oscillation frequency and into higher frequencies. The reduction of spur occurrence and/or the increased frequency values between the spurs and the desired oscillation frequency can increase the ability of the phase lock loop to conform to specifications such as the 3rd Generation Partnership Project ("3GPP") specifications.

In one embodiment, the present invention is a multi-phase oscillator including an oscillator signal line, a reference clock signal line transmitting a reference clock signal, a first latch connected to the oscillator signal line, and the reference clock signal line, the first latch receiving the reference clock signal from the reference clock signal line, and a variable capacitor connected to the oscillator signal line, and the reference clock signal line, and located adjacent the first latch.

In another embodiment, the present invention includes an all digital phase lock loop including a reference clock signal line for transmitting a reference clock signal, a multiplying unit receiving the reference clock signal and generating a frequency multiplied reference clock signal, a multi-phase oscillator receiving the frequency multiplied reference clock signal and generating a fractional phase signal, and a counter receiving the reference clock signal and generating an integer phase signal.

In yet another embodiment, the present invention is a method for reducing frequency pulling in a multi-phase oscillator including generating a first capacitance having a first variable capacitance value using a first latch in the multi-phase oscillator, and generating a second capacitance having second variable capacitance value using a variable capacitor located adjacent the first latch in the multi-phase oscillator.

In still another embodiment, the present invention is a method for reducing an occurrence of spur frequency adjacent an oscillation frequency in an all digital phase lock loop including multiplying a reference clock signal to generate a frequency multiplied reference clock signal, generating a fractional phase signal using the frequency multiplied reference clock signal, and generating an integer phase signal using the reference clock signal.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings.

DETAILED DESCRIPTION OF THE PREFERRED EMBODIMENTS

Reference will now be made in detail to the preferred embodiments of the invention which set forth the best modes contemplated to carry out the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, modeling procedures have not been described in detail as not to unnecessarily obscure aspects of the present invention.

Figure 1:
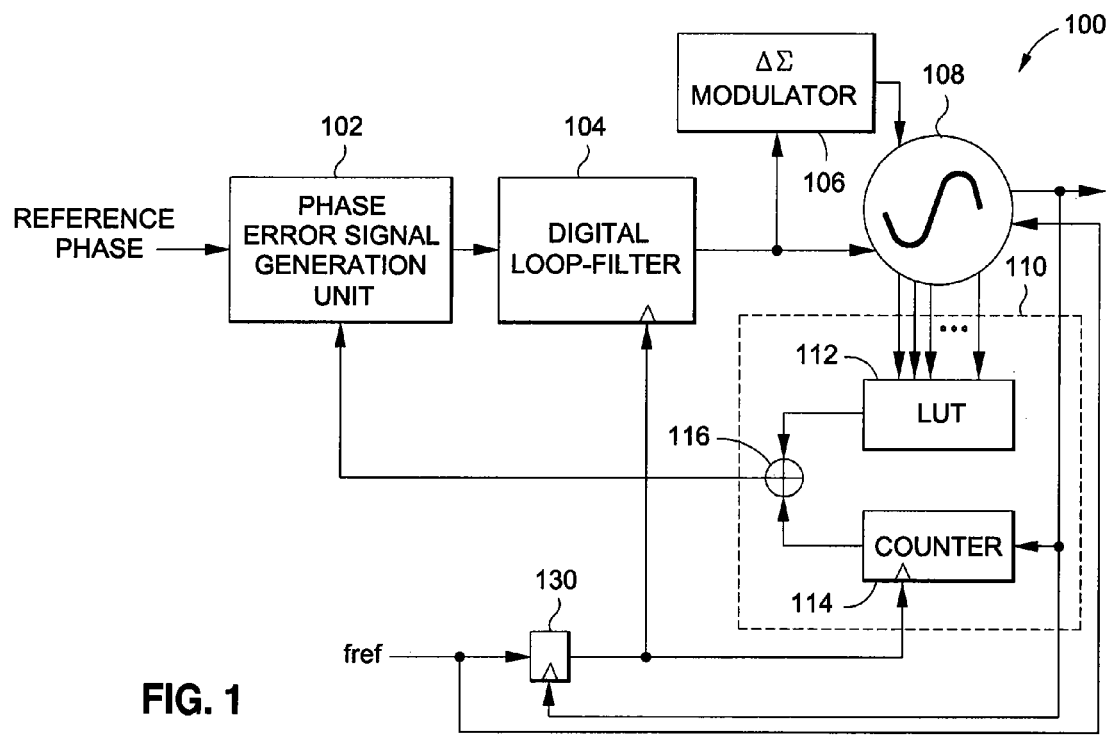
FIG. 1 is a block diagram of a phase lock loop.

In one embodiment, the present invention includes a phase lock loop 100 as shown, for example, in FIG. 1. The phase lock loop can be, for example, an all digital phase lock loop. The phase lock loop 100 can include, for example, a phase error signal generation unit 102, a digital loop-filter 104, a ΔΣ modulator 106, a multi-phase oscillator 108, a phase to digital converter 110, and a latch 130.

The phase error signal generation unit 102 is connected, for example, to the digital loop-filter 104 and/or the phase to digital converter 110. The phase error signal generation unit 102 receives, for example, a phase signal from the phase to digital converter and a reference phase signal. The phase error signal generation unit 102 can determine the difference between the reference phase signal and the phase signal to generate a phase error signal.

The digital loop-filter 104 is connected, for example, to the phase error signal generation unit 102, the ΔΣ modulator 106, the latch 130, and/or the multi-phase oscillator 108. The digital loop-filter 104 can, for example, receive and filter out high frequencies in the phase error signal to generate a filtered phase error signal. The removal of the high frequencies can increase, for example, a stability of the phase lock loop due to its feedback nature. The ΔΣ modulator 106 is connected, for example, to the digital loop-filter unit 104 and/or the multi-phase oscillator 108. The ΔΣ modulator 106 can receive and perform a noise shaping function on the filtered phase error signal. The filtered phase error signal is then transmitted to the multi-phase oscillator 108.

The multi-phase oscillator 108 is connected, for example, to the ΔΣ modulator 106 and/or the phase to digital converter 110. The multi-phase oscillator 108 can receive, for example, the filtered phase error signal and generate a multi-phase signal using latches in the multi-phase oscillator 108. The multi-phase oscillator 108 can also generate a non-latched output without using the latches in the multi-phase oscillator. The multi-phase oscillator 108 receives the reference clock signal fref on a reference clock signal line to clock the latches in the multi-phase oscillator 108. The multi-phase signals can be used, for example, to generate fractional phase signals while the non-latched output can be used, for example, to generate integer phase signals. The multi-phase oscillator 108 can be, for example, a rotary traveling wave oscillator ("RTWO") or a ring oscillator.

The phase to digital converter 110 is connected to the multi-phase oscillator 108 and/or the phase error signal generation unit 102. The phase to digital converter 110 receives the multi-phase signals clocked by the reference clock signal fref and generates a fractional phase signal. An integer phase signal is generated by counting the number of periods of the multi-phase oscillator's output. The fractional phase signal can correspond to the fractional phase of the phase rotation for the multi-phase oscillator 108 and an integer phase signal can correspond to the integer phase of the phase rotation for the multi-phase oscillator 108.

In one embodiment, the phase to digital converter 110 includes, for example, a lookup table 112, a counter 114, and/or a combining unit 116. The lookup table 112 can receive, for example, the multi-phase signals and generate a fractional phase signal. The counter 114 can receive the non-latched output from the multi-phase oscillator 108 and generate, for example, an integer phase signal. The combining unit 116 receives, for example, the fractional phase signal and the integer phase signal, and combines the fractional phase signal and the integer phase signal to generate the phase signal. The latch 130 can receive the reference clock signal fref and clock the digital loop-filter 104 and the counter 114. The latch 130 can be clocked, for example, by the non-latched output from the multi-phase oscillator 108.

Figure 2:
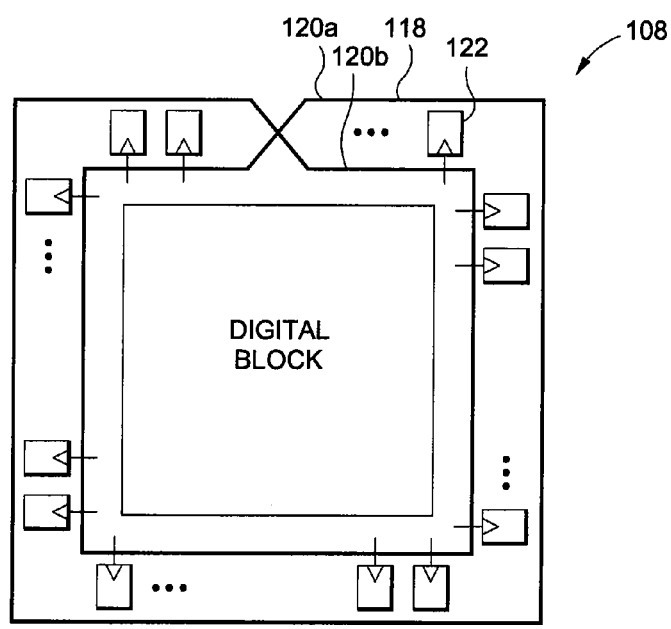
FIG. 2 depicts a multi-phase oscillator.
Figure 3:
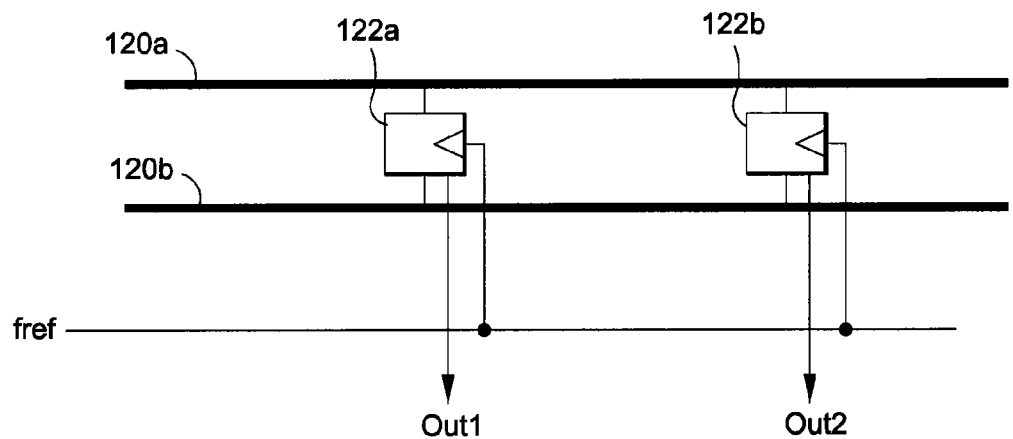
FIG. 3 depicts latches in a multi-phase oscillator.

The multi-phase oscillator 108 can be seen, for example, in FIG. 2 and FIG. 3. In FIG. 2, multi-phase oscillator 108 includes a differential line 118. The differential line 118 can be, for example, a closed-loop transmission line including a transmission line 120a and/or a transmission line 120b. The differential line 118 can be, for example, an oscillator signal line. In FIG. 2, a –Gm cell formed, for example, from transistors, are not shown for simplification. In addition, varactors are also not shown for simplification. However, a person having ordinary skill in the arts would know that the –Gm cell and/or the varactors for frequency tuning can be included. A plurality of latches 122 are connected to the differential line 118. As seen in FIG. 3, the latches 122 can include, for example, the latches 122a and/or the latches 122b. The latches 122a and/or the latches 122b receives the reference clock signal fref on a reference clock signal line. The reference clock signal fref clocks the latches 122 such as the latches 122a and/or the latches 122b.

Figure 4:
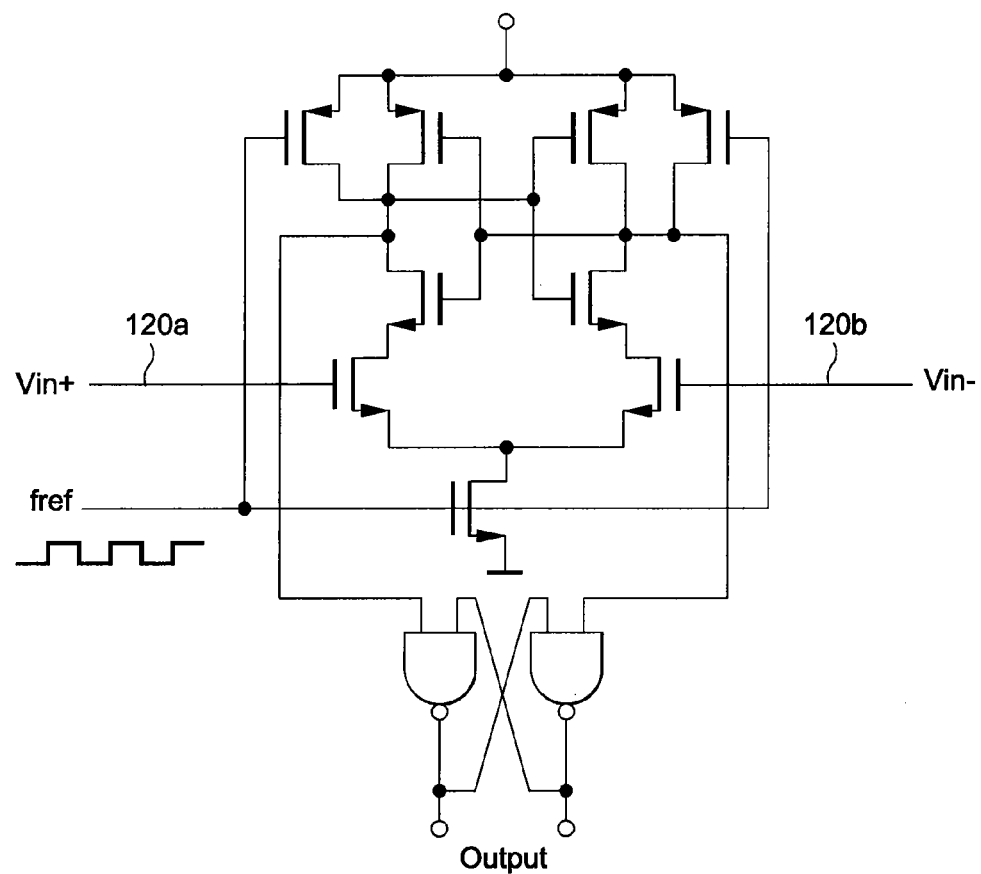
FIG. 4 depicts a circuit diagram of a latch in a multi-phase oscillator.

A configuration of one of the latches 122 can be seen, for example in FIG. 4. However, each of the latches 122 generates an input impedance that varies during the operation of the latches 122. This variation is problematic since generally it is desirable to have a substantially constant impedance. In one embodiment, the impedance can be, for example, a capacitance.

In one embodiment, dummy cells can correspond, for example to the latches 122 and can be placed, for example, adjacent to one or more of the latches 122. Each of the dummy cells can have a variable capacitance value that corresponds to a capacitance of the corresponding latch which the dummy cell is adjacent. The variable capacitance value of each the dummy cells can have a variable capacitance value that is the opposite of the variable capacitance value of the corresponding latch. The dummy cells can be any type of components which can have a variable capacitance value that is the opposite of the variable capacitance value of the corresponding latch which has fluctuating variable capacitance values based on a polarity of the reference clock signal.

Thus, a sum of the variable capacitance value of each of the dummy cells and the variable capacitance value of the corresponding latch remains substantially the same, even when the variable capacitance value of the corresponding latch fluctuates due to the polarity of the reference clock signal fref on the reference clock signal line, because the variable capacitance value of each of the dummy cells fluctuates in a corresponding manner. In one embodiment, the sum of the variable capacitance value of each of the dummy cells and the variable capacitance value of the corresponding latch is remains substantially at a target variable capacitance value. In other words, the variable capacitance value of each of the dummy cells can be equal to the difference between the target variable capacitance value and the variable capacitance value of the corresponding latch.

Figure 5:
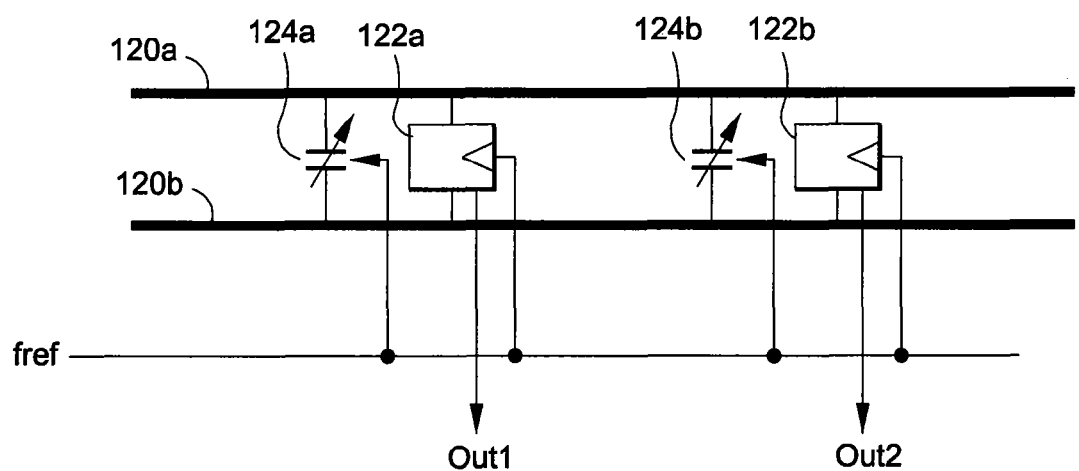
FIG. 5 depicts latches and variable capacitors in the multi-phase oscillator according to an embodiment of the present invention.

In FIG. 5, the dummy cells are variable capacitors such as variable capacitors 124a and 124b. As seen in FIG. 5, the variable capacitors 124a and 124b are placed adjacent their corresponding latches 122a and 122b, respectively. The variable capacitors 124a and 124b like the latches 122a and 122b are connected, for example, to the transmission line 120a and the transmission line 120b of the differential line 118. Thus, the variable capacitor 124a can have a variable capacitance value that corresponds to the variable capacitance value of the latch 122a and the variable capacitor 124b can have a variable capacitance value that corresponds to the variable capacitance value of the latch 122b. Therefore, the variable capacitors 124a and 124b maintains the target variable capacitance value at a substantially constant value by balancing the variable capacitance value of the latches 122a and 122b. In one embodiment, the variable capacitors 124a and 124b also receive the reference clock signal fref on the reference clock signal line.

Although only the variable capacitors 124a and 124b are shown in FIG. 5, any number of variable capacitors can be used. In one embodiment, the number of variable capacitors and the number of latches are equal or substantially equal to each other.

Figure 6:
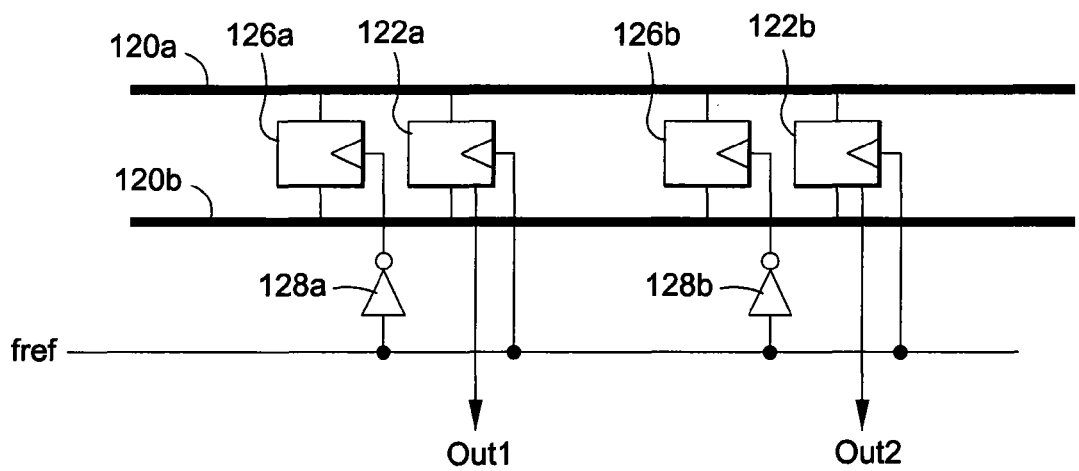
FIG. 6 depicts latches and dummy cells in the multi-phase oscillator according to an embodiment of the present invention.

In FIG. 6, the dummy cells are dummy latches such as latches 126a and 126b. As seen in FIG. 6, the dummy latches 126a and 126b are placed adjacent their corresponding latches 122a and 122b, respectively. The dummy latches 126a and 126b can be latches with a similar construction as the latches 122a and 122b. The dummy latches 126a and 126b can also be considered, for example, to be variable capacitors.

The dummy latches 126a and 126b, like the latches 122a and 122b are connected, for example, to the transmission line 120a and the transmission line 120b of the differential line 118. Thus, the dummy latch 126a can have a variable capacitance value that corresponds to the variable capacitance value of the latch 122a, and the dummy latch 126b can have a variable capacitance value that corresponds to the variable capacitance value of the latch 122b. However, the dummy latches 126a and 126b are connected to the reference clock signal fref on the reference clock signal line through inverters 128a and 128b respectively and are clocked by the opposite polarity of the reference clock signal fref as the latches 122a and 122b. Through the use of the inverters 128a and 128b, the dummy latches 126a and 126b each receive an inverted reference clock signal.

Thus, the dummy latches 126a and 126b maintains the target variable capacitance value at a substantially constant value by balancing the variable capacitance value of the latches 122a and 122b. For example, when the latches 122a and 122b are clocked by the reference clock signal fref, the latches 126a and 126 are not clocked. However, when the latches 126a and 126b are clocked by the reference clock signal fref, the latches 122a and 122b are not clocked.

Although only the latches 126a and 126b are shown in FIG. 6, any number of latches can be used. In one embodiment, the number of variable capacitors and the number of latches are equal or substantially equal to each other.

Figure 7:
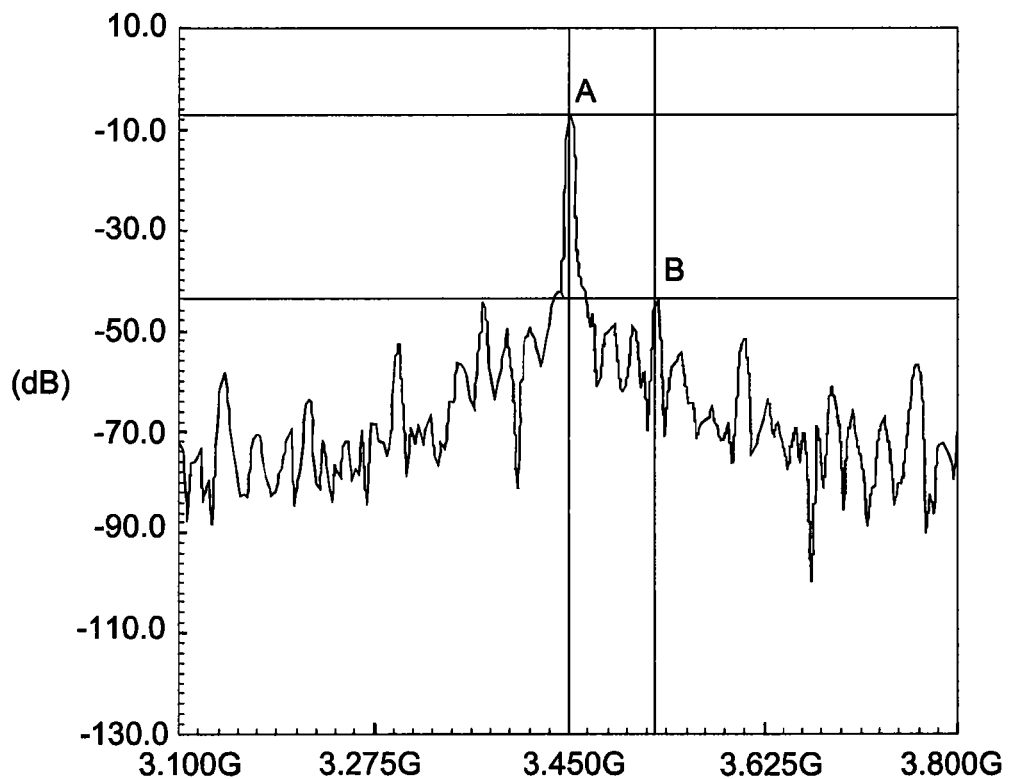
FIG. 7 is a graph of a power spectral density of a conventional phase lock loop.
Figure 8:
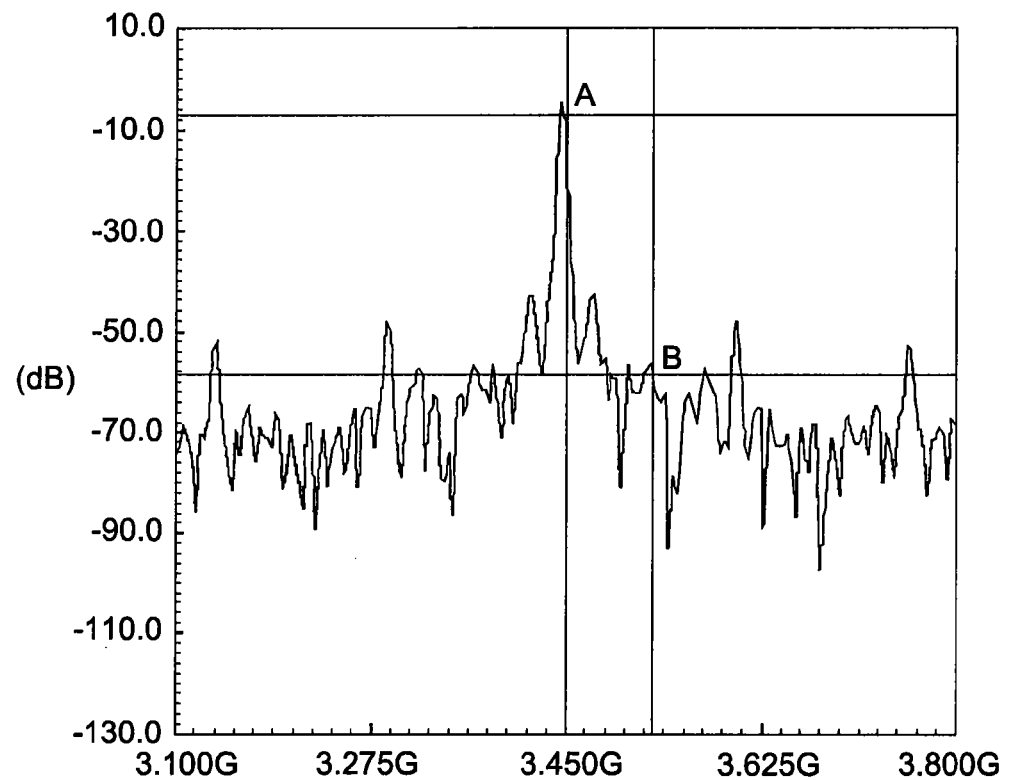
FIG. 8 is a graph of a power spectral density of a conventional phase lock loop according to an embodiment of the present invention.

Through the use of the dummy cells, spurs in the output frequency of the digital phase lock loop 100 are reduced. This can be seen, for example, in a comparison of the output spectrum of the output of a conventional digital phase lock loop and the output spectrum of the output of the digital phase lock loop 100 as seen in FIG. 7 and FIG. 8, respectively. The frequency of the reference clock signal fref ("reference frequency") is set to be 78 MHz. FIG. 7 depicts, for example, the output spectrum of the conventional phase lock loop. Line A depicts, for example, a desired oscillation frequency of the conventional phase lock loop while line B indicates, for example, a reference frequency, or 78 MHz away from the oscillation frequency.

As can be seen in FIG. 7, spurs periodically appear at certain frequencies away from the oscillation frequency and can be seen at line B. Spurs generally appear periodically at reference frequency intervals from the oscillation frequency. The presence of spurs can reduce the ability of the output of the conventional phase lock loop to be within specifications such as the 3rd Generation Partnership Project ("3GPP") specifications.

FIG. 8 depicts, for example, the output spectrum of the phase lock loop 100. Line A depicts the desired oscillation frequency of the phase lock loop 100 while line B indicates, for example, a frequency 78 MHz away from the oscillation frequency. As can be seen in FIG. 8, through the use of the dummy cells such as variable capacitors 124a and 124b (FIG. 5) or dummy latches 126a and 126b (FIG. 6), the capacitance of some or all of the latches 122 in the multi-phase oscillator 108 (FIG. 2) is summed to be at a target variable capacitance value. By counter-balancing the variable capacitance values of some or all of the latches 122, a reduction in spurs at a frequency 78 MHz away from the oscillation frequency can be achieved. The spurs can be suppressed, for example by 8-10 dB which can substantially reduce or eliminate the spurs. For example, at line B, which is 78 MHz away from the oscillation frequency, the spur is now removed. This increases the ability of the output of the conventional phase lock loop to be within specifications such as the 3GPP specifications.

Figure 9:
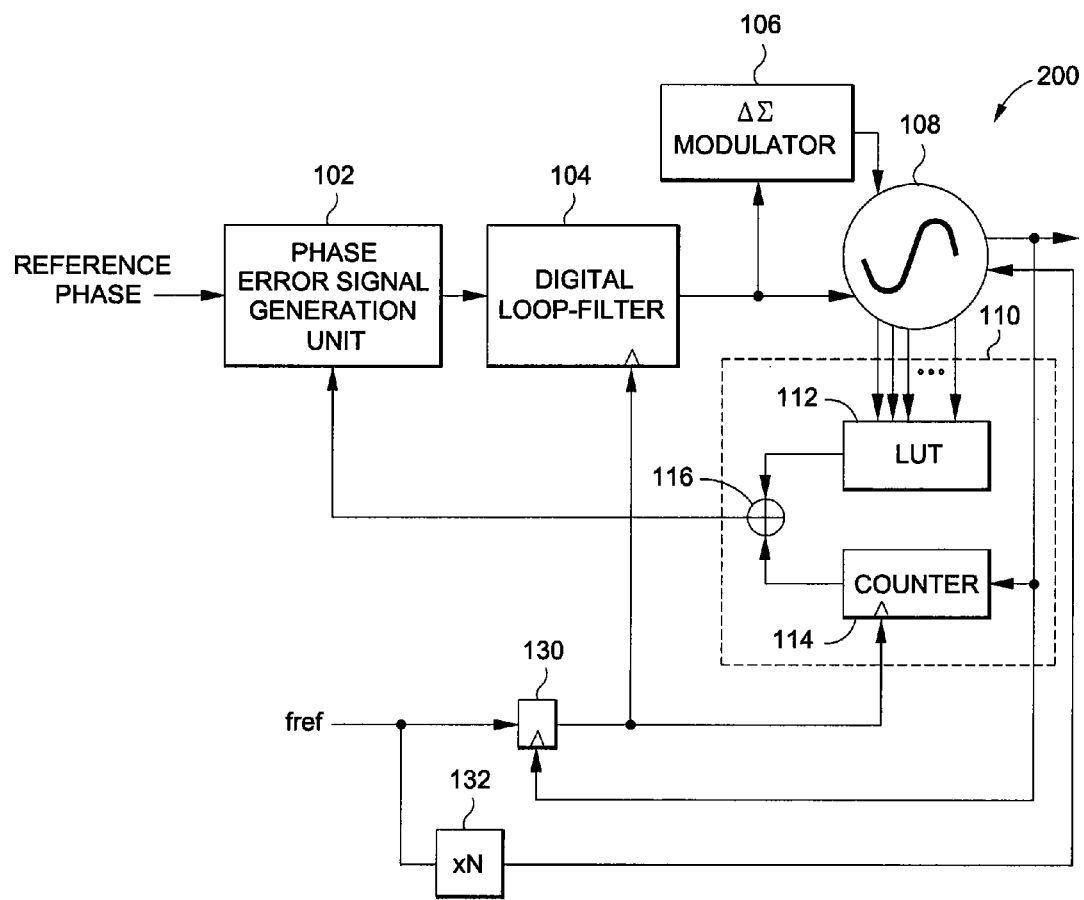
FIG. 9 is a phase lock loop including a multiplying unit according to an embodiment of the present invention.

In one embodiment, the present invention is a phase lock loop 200 as shown in FIG. 9. The phase lock loop 200 utilizes, for example, a multiplying unit 132. The multiplying unit 132 receives, for example, the reference clock signal fref and multiplies it by N to generate a frequency multiplied reference clock signal. N can be, for example, any integer value. For example, N can be equal to 2, 3, 4, 5, etc. Although current consumption can be increased with an increased value of N, spur suppression and/or removal can also be increased with the increased value of N.

Figure 10:
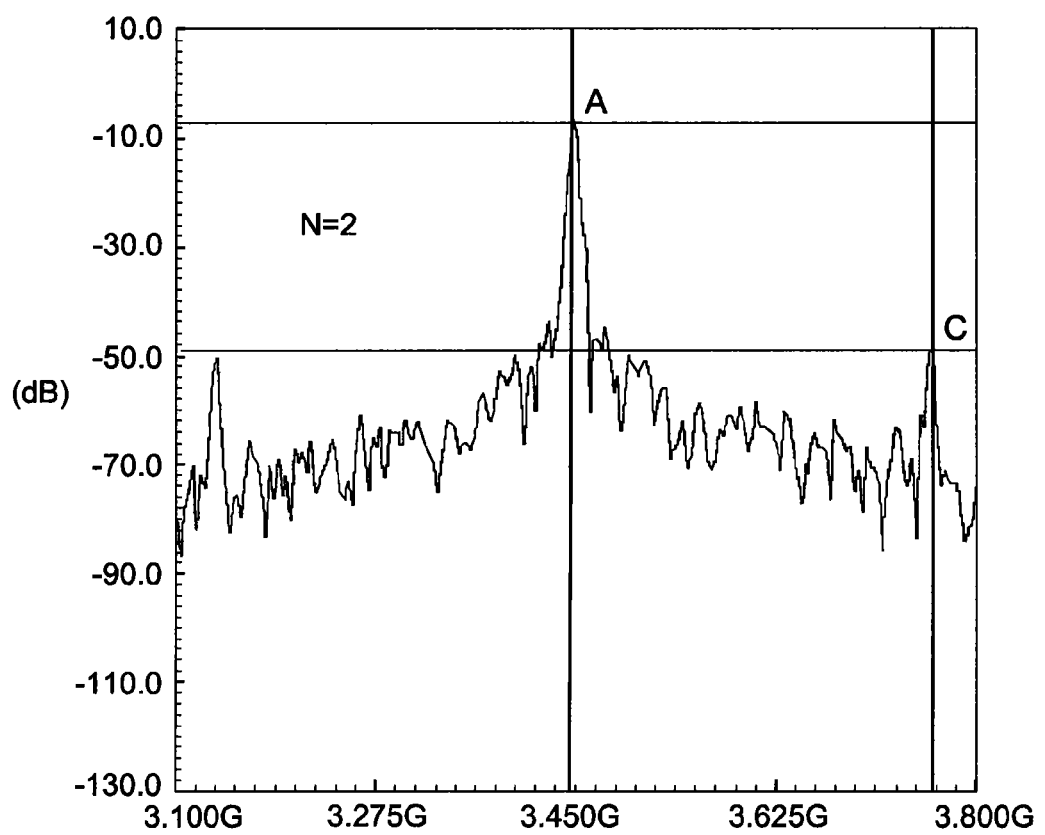
FIG. 10 is a is a graph of a power spectral density of a conventional phase lock loop according to an embodiment of the present invention.

The frequency multiplied reference clock signal is sent to the multi-phase oscillator instead of the reference clock signal fref. By multiplying the reference clock signal, the multi-phase oscillator is clocked at a higher frequency which can push the occurrences of spurs at a frequency away from the oscillation frequency and into higher frequencies. This can be seen, for example, in FIG. 10. In FIG. 10, line C represents the first occurrence of a spur for the output frequency of the phase lock loop 200 including the multiplying unit 132. As can be seen, the first instance of the spur is greater than 78 MHz.

Figure 11:
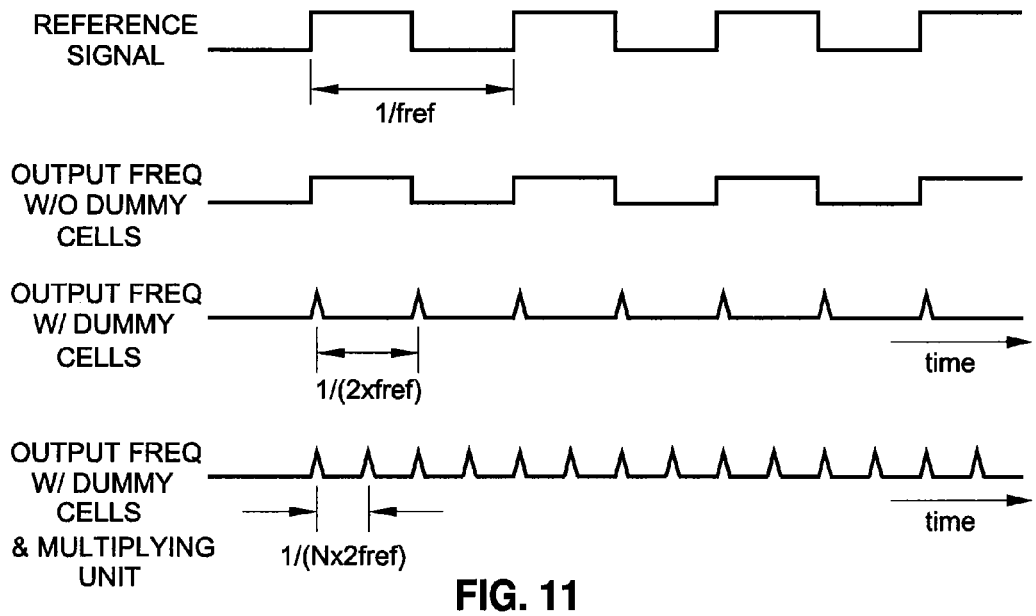
FIG. 11 is a timing chart including various output frequencies for various phase lock loops.

In one embodiment, dummy cells can also be used with a multiplying unit to further reduce an occurrence of spurs and/or to push the spurs further away from the oscillation frequency. A comparison of the various output spectrums can also be seen in FIG. 11. In FIG. 11, it is generally more desirable not to have slow periodicity to avoid spurs close to a desired oscillation frequency. This can be seen, for example, through a comparison of the output spectrum without dummy cells, a more desirable output spectrum with dummy cells, and an even more desirable output spectrum with dummy cells and multiplying unit. The output spectrum without dummy cells has a period of 1/fref, while the output spectrum with dummy cells has a period of 1/(2×fref), and the output spectrum with dummy cells and the multiplying unit has a period of 1/(N×2fref). A reduction in the period corresponds to an increase in the frequency offset of the spurs.

Figure 12:
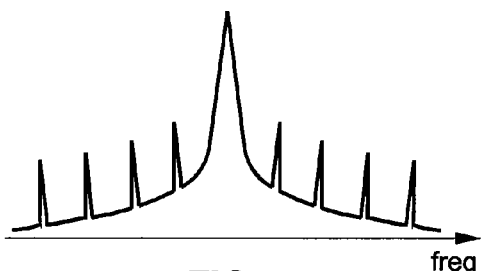
FIG. 12 is a graph of an output spectrum for a phase lock loop without dummy cells.
Figure 13:
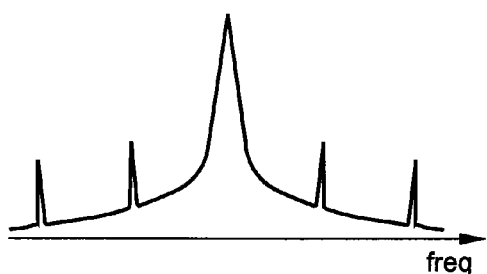
FIG. 13 is a graph of an output spectrum for a phase lock loop including dummy cells according to an embodiment of the present invention.
Figure 14:
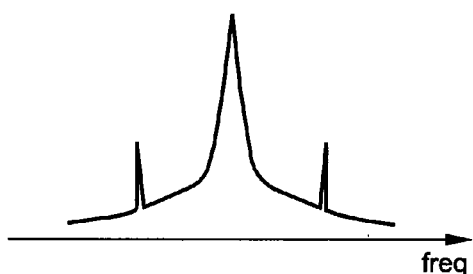
FIG. 14 is a graph of an output spectrum for a phase lock loop including dummy cells and a multiplying unit according to an embodiment of the present invention.

The appearance of the spurs can also be seen in FIG. 12, FIG. 13, and FIG. 14. In FIG. 12, the output spectrum of the phase lock loop without the dummy cells are depicted. As can be seen, spurs occur fairly often at fref spacings. There are, for example, 8 spurs shown in FIG. 12. In FIG. 13, the output frequency of the phase lock loop including the dummy cells is shown. As can be seen, spur occurrence is reduced as they occur only at 2×fref frequency spacings. Thus, there are only 4 spurs shown in FIG. 13. In FIG. 14, the output frequency of the phase lock loop including the dummy cells and the multiplying unit is shown. As can be seen, spur occurrence is further reduced as they occur only at 2×N×fref frequency spacings. Thus, there are only 2 spurs shown in FIG. 14.

Thus, with the use of the dummy cells and/or the multiplying unit in the phase lock loop, frequency pulling by the latches in the multi-phase oscillator is reduced. Since frequency pulling generally causes spurs, the reduction in frequency pulling in the multi-phase oscillator also reduces the occurrence of spurs in the output of the phase lock loop. Therefore, using the dummy cells and/or the multiplying unit in a phase lock loop, the occurrence of spurs can be reduced. In addition the closest distance between any spur and the desired oscillation frequency increases.

In view of the placement and the number of the dummy cells, it is desirable to place each dummy cell adjacent to the corresponding latches 122 and to have the same number of dummy cells as the latches 122. As long as the total capacitance of the latches and the dummy cells are constant, however, similar effects on reducing the spurs can be expected even if the placement of the dummy cells are not exactly adjacent to the corresponding latches 122 and/or the number of the dummy cells are not exactly the same as the corresponding latches 122.

Those of ordinary skill would appreciate that the various illustrative logical blocks, modules, and algorithm steps described in connection with the examples disclosed herein may be implemented as electronic hardware, computer software, or combinations of both. Furthermore, the present invention can also be embodied on a machine readable medium causing a processor or computer to perform or execute certain functions.

To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosed apparatus and methods.

The various illustrative logical blocks, units, modules, and circuits described in connection with the examples disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the examples disclosed herein may be embodied directly in hardware, in a software module executed by a processor, or in a combination of the two. The steps of the method or algorithm may also be performed in an alternate order from those provided in the examples. A software module may reside in random access memory (RAM), flash memory, read-only memory (ROM), erasable programmable read only memory (EPROM), electrically erasable programmable read-only memory (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a wireless modem. In the alternative, the processor and the storage medium may reside as discrete components in the wireless modem.

The previous description of the disclosed examples is provided to enable any person of ordinary skill in the art to make or use the disclosed methods and apparatus. Various modifications to these examples will be readily apparent to those skilled in the art, and the principles defined herein may be applied to other examples without departing from the spirit or scope of the disclosed method and apparatus. The described embodiments are to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A multi-phase oscillator comprising:
   an oscillator signal line;
   a reference clock signal line transmitting a reference clock signal;
   a first latch connected to the oscillator signal line, and the reference clock signal line, the first latch receiving the reference clock signal from the reference clock signal line; and
   a variable capacitor connected to the oscillator signal line, and the reference clock signal line, and located adjacent the first latch,
   wherein the first latch has a first variable capacitance value, and the variable capacitor has a second variable capacitance value such that a sum of the second variable capacitance value and the first variable capacitance value remains substantially constant.

2. The multi-phase oscillator of claim 1 wherein the variable capacitor receives the reference clock signal from the reference clock signal line.

3. A multi-phase oscillator comprising:
   an oscillator signal line;
   a reference clock signal line transmitting a reference clock signal;
   a first latch connected to the oscillator signal line, and the reference clock signal line, the first latch receiving the reference clock signal from the reference clock signal line; and
   a variable capacitor connected to the oscillator signal line, and the reference clock signal line, and located adjacent the first latch, and the second latch receives an inverted reference clock signal.

4. The multi-phase oscillator of claim 3 further comprising an inverter connected between the second latch and the reference clock signal line to invert the reference clock signal from the reference clock signal line and to generate the inverted reference clock signal.

5. A method for reducing frequency pulling in a multi-phase oscillator comprising:
   generating a first capacitance having a first variable capacitance value using a first latch in the multi-phase oscillator;
   generating a second capacitance having second variable capacitance value using a variable capacitor located adjacent the first latch in the multi-phase oscillator; and
   adjusting the second variable capacitance value such that a sum of the second variable capacitance value and the first variable capacitance value remains substantially constant.

6. The method of claim 5 wherein the variable capacitor is a second latch.

7. The method of claim 6 further comprising receiving an inverted reference clock signal at the second latch.

* * * * *